SELF ADJUSTING TRANSISTOR BIASING CIRCUIT

Filed Jan. 3, 1961

INVENTORS:
RICHARD T. MYERS,
RICHARD T. BUESING,
BY I. David Blumenfeld
THEIR ATTORNEY.

United States Patent Office 3,202,924

Patented Aug. 24, 1965

3,202,924

SELF ADJUSTING TRANSISTOR BIASING CIRCUIT

Richard T. Myers and Richard T. Buesing, Lynchburg, Va., assignors to General Electric Company, a corporation of New York Filed Jan. 3, 1961, Ser. No. 80,166
9 Claims. (Cl. 330—22)

This invention relates to a transistor power amplifier circuit, and more particularly, to an amplifier having a self-adjusting bias circuit.

It is a primary object of this invention to provide a transistor power amplifier which provides high stability of emitter bias current but does not use a high value of emitter resistance.

Transistor power amplifiers, and particularly those that are used in mobile communication systems, must often satisfy conflicting requirements. For example, in mobile communication equipment, the output power amplifiers and speakers are detachable plug-in units which are connected to the receiver channels upon installation of the equipment in the vehicle. The receiver and amplifier circuits may, therefore, not be perfectly matched and there may be gain variations from unit to unit. In the past, it has been customary to use a large resistor in the emitter circuit of the transistor power amplifier in order to stabilize the gain of the system. The solution is unsatisfactory, however, since in solving one problem it introduces another one. The use of a large emitter resistance increases the $I^2R$ loss and therefore constitutes a large power drain in the system.

In order to avoid large power drains while simultaneously maintaining the available collector to base voltage of the power transistor as high as possible and to maintain the correct emitter current, it has been proposed to place a large adjustable resistor in the base circuit to stabilize gain both in the power amplifier stage and in the preceding stages. This also has proved to be a far from satisfactory expedient, since individual settings and adjustment of the control resistance is costly in production and in the field. Furthermore, failure to set the control resistance at the proper level may cause thermal runaway of the transistor, damaging the unit and resulting in costly repairs.

It is therefore a further object of this invention to provide a transistor power amplifier circuit which has a self adjusting biasing arrangement;

Another object of this invention is to provide a transistor power amplifier which provides a low power drain on the power supply system;

Yet another object of this invention is to provide a transistor power amplifier in which the gain is maintained substantially constant in spite of variations in the circuit conditions;

Other objects and advantages of this invention will become apparent as the description thereof proceeds.

In accordance with the invention, the foregoing objects are accomplished by providing a transistor power amplifier circuit arrangement including a current diverting path in shunt with the amplifier. The variable current diverting path includes a transistor, the conductivity of which is controlled in response to the emitter current of the power amplifier. Variations in the amplifier emitter current vary the conductivity of the transistor in the current diverting path causing it to draw sufficient current to vary the gain of the amplifier and stabilizing the emitter current at a predetermined level.

The novel features which are believed to be characteristic of this invention are set forth with particularity in the appended claims. The invention itself, however, both as to its organization and method of operation, together with further objects and advantages thereof, may best be understood by reference to the following description taken in connection with the accompanying drawings, in which:

Figures 1, 2, 3:
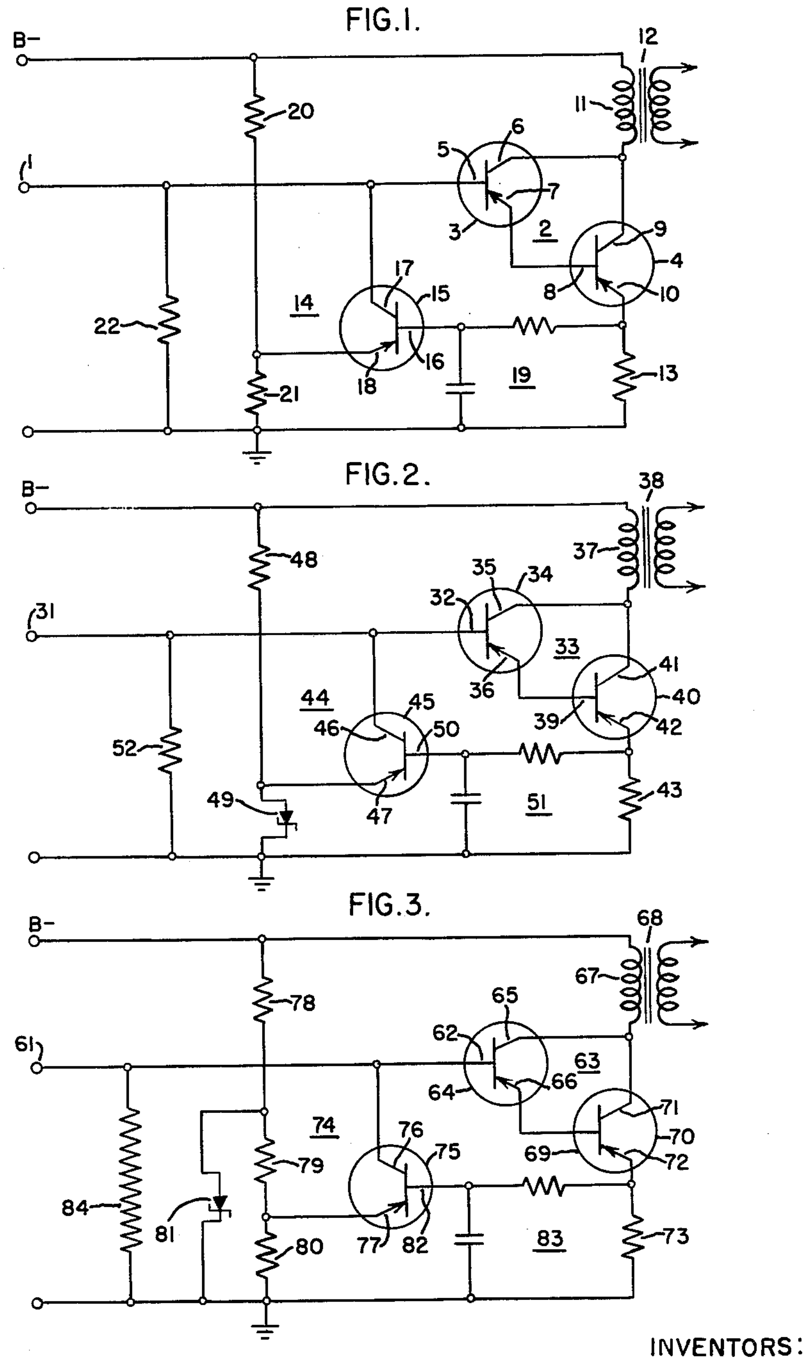
FIGURE 1 is a diagrammatic illustration of one embodiment of the power amplifier of the invention.
FIGURE 2 is a circuit diagram of an alternative embodiment of the invention.
FIGURE 3 is yet a third embodiment of a power amplifier circuit embodying the instant invention.

The invention will be most readily understood by reference to FIGURE 1, in which a transistor power amplifier circuit having a self adjusting bias arrangement is illustrated. An input current is impressed upon terminal 1 and applied to a compound transistor circuit illustrated generally at 2 in which two PNP transistors 3 and 4 are connected in a compound configuration which is known in the art as a "Darlington circuit." Compound circuit 2 may be considered as the equivalent of a single three-terminal transistor in a common emitter configuration having an emitter current ratio Beta ($\beta_T$) which is equal to the product of the individual emitter factors ($\beta_3$) and ($\beta_4$) of transistors 3 and 4.

Transistor 3 includes base 5, emitter 7 and collector 6. Transistor 4 includes a base 8, connected to the emitter of transistor 3, a collector 9 and an emitter 10. The collectors of both transistors are connected to the primary winding 11 of an output transformer 12 the secondary of which may be connected to the speaker or a similar utilization circuit. For a more detailed description of such compound circuits reference is hereby made to Chapter 4, Sec. 6.2, pp. 130–133 of Transistor Circuit Engineering, R. F. Shea (Ed.), John Wiley & Sons, Inc., (New York), 1957.

The collector current drawn by the two transistors and hence the current flowing through the primary winding 11 is the sum of the collector currents of the two transistors since both of these are connected to one terminal of primary winding 11. Bias conditions for compound circuit 2 are provided by connecting the collectors through the primary winding 11 to a negative terminal B— of a source of direct current energizing potential, the positive terminal of which is grounded. Emitter 10 of transistor 4 is connected to ground potential through a low value, preferably on the order of one (1) ohm, emitter resistance 13. The input current from terminal 1 flowing into the base of transistor 3 controls the flow of collector current, as well as the emitter current drawn by emitter 7. Changes in emitter current produce a corresponding change in base current of transistor 4 since emitter 7 is connected to base 8. This change in the base current, as may be expected, controls the emitter and collector currents drawn by transistor 4 so that the total current supplied by the two transistors to output transformer 12 is the sum of the collector currents of transistors 3 and 4.

A current diverting path is provided between terminal 1 and ground to control the gain of the circuit and stabilize the emitter current flow. Path 14 includes a PNP transistor 15, which upon becoming conductive, diverts a portion of the current flowing into base 5 of transistor 3. The conductivity of transistor 15, and hence the amount of current diverted, is varied in response to changes in the emitter current of transistor 4 in order to control the gain of the power amplifier. Transistor 15 includes a base 16, a collector 17 connected to the base of transistor 5 and the input terminal 1, and an emitter electrode 18 connected to the junction of voltage dividing resistances 20 and 21 connected between the B— terminal and ground. Base 16 of transistor 15 is connected through an R.C. decoupling circuit 19 to the junction of emitter resistance 13 and the emitter 10 of transistor 4.

Resistances 20 and 21 establish a reference voltage at emitter 18. Changes in emitter current of transistor 4 establish a voltage drop across resistance 13 which controls the conductivity of transistor 15 and the magnitude of the diverted current. Current flows into base 16 whenever emitter 10 of transistor 4 is more negative than the reference potential set by resistances 20 and 21 and the base to emitter voltage $V_{EB}$ of transistor 15. Thus if transistor 4 is drawing the proper emitter current, emitter 10 is slightly more positive than emitter 18 and transistor 15 is in a quiescent condition. If the emitter current of transistor 4 rises above a predetermined value due to circuit condition changes, the voltage drop across resistance 13 increases and the junction of emitter 10 and resistance 13 becomes sufficiently negative for base current to flow in transistor 15. When transistor 15 draws base current, it also draws collector current. Since collector 17 is connected to the terminal 1, which in turn is connected to a fixed current source, such as the collector of a previous transistor stage, a portion of the input current is diverted through transistor 15 and the base current available to transistor 4 of the compound circuit 2 is reduced. This, in turn, decreases the emitter current flowing in transistor 4 and the base current in transistor 4. The reduction in base current decreases the emitter current until the voltage across the emitter resistance 13 is less than the reference voltage established by resistances 20 and 21 and the base emitter voltage $V_{EB}$ of transistor 15. The emitter current of transistor 4 is thus continually adjusted to the desired value even though the current available at terminal 1 varies.

A bleeder resistance 21 is connected between terminal 1 and ground potential, so that the circuit will not draw appreciable current when there is no current supplied through terminal 1. In the absence of bleeder resistance 22 the leakage current between collector 6 and base 5 of transistor 3 flows across the base to emitter diode of transistor 3 and thence into the base of transistor 4 increasing the current drawn by emitter 10. This would increase the base current further and the process would continue to some equilibrium value. This current is wasted current (and power) since it flows when no signal is present. Bleeder resistance is provided to provide a path for this leakage current ($I_{CO}$), so that very little power will be used during periods of no input current at terminal 1.

FIGURE 2 is an alternative embodiment of the self-biasing transistor power amplifier of FIGURE 1 in which the circuit gain and the emitter current drawn is also stabilized against fluctuations in the unidirectional biasing source. The reference voltage for the current diverting transistor is controlled by the voltage divider connected across the unidirectional power source. Any variations in the unidirectional biasing voltage source varies the point at which the transistor conducts and hence may vary the emitter current reference level and the gain of the circuit. It is therefore desirable that an arrangement be provided to stabilize the circuit against fluctuations in the unidirectional voltage. To this end, a constant voltage device, such as a Zener diode, is used in place of one of the resistance elements of the voltage divider so that any voltage variations in the unidirectional source do not affect the reference biasing level of the shunt transistor. FIGURE 2 includes an input terminal 31 connected to a current source such as the collector electrode of a prior transistor stage. Terminal 31 is connected to a compound transistor circuit 33 comprising PNP transistors 34 and 40 connected in a common emitter configuration. The transistor 34 includes a base 32, a collector 35 and an emitter 36. Collector 35 is connected to one end of primary winding 37 of an output transformer 38. Emitter 36 is connected to the base 39 of the second PNP transistor 40 which also includes a collector 41 connected to the primary winding 37. Emitter 42 of transistor 40 is connected through a low resistance emitter resistor 43 to a common grounded bus.

A current diverting transistor element 44 is connected in shunt with the input terminal and diverts current from the base of transistor 34 in response to the emitter current variations of transistor 40. The current diverting circuit 44 comprises a PNP transistor 45 having a collector 46 connected directly to the junction of input terminal 31 and base 32. Emitter 47 is connected to the junction of a voltage divider comprising a resistance element 48 and a constant voltage Zener diode element 49 connected in series between the negative terminal B— of the unidirectional energy source and ground. The base 50 of transistor 45 is connected through an R.C. decoupling network 51 to the junction of emitter resistance 32 and the emitter 42 of transistor 40.

Zener diode 49, as understood by those skilled in the art, is a constant voltage element. Any increase of applied voltage across its terminals causes it to draw more current reducing the voltage across its terminal to a predetermined value. Thus any variations in the unidirectional voltage at terminal B— does not effect the reference voltage established at emitter 47 of transistor 45. In this manner the circuit is stabilized against fluctuations in the unidirectional energizing voltage and the gain of the entire amplifier circuit is maintained substantially constant.

Under some conditions, the reference voltage to be mainained at the emitter of the current diverting transistor is less than the breakdown voltage of available Zener diodes. It is, therefore, necessary to modify the circuit of FIGURE 2 in the manner shown in FIGURE 3.

An input current signal is applied from a previous transistor stage to the input terminal 61 of the circuit of FIGURE 3 and thence to the base 62 of the first stage of a compound transistor circuit 63 connected in the common emitter configuration. Compound circuit 63 includes a first PNP transistor 64 having a collector 65, an emitter 66 and a base 62. Collector 65 is connected to the primary winding 67 of an output transformer 68 and emitter 66 is connected to the base 69 of a second PNP transistor 70. Collector 71 of transistor 70 is also connected to the primary winding 67 of the output transformer. In this fashion, the collector currents of both transistors are applied to the primary winding to drive the output circuit which may be the speaker of a mobile radio receiver. Emitter 72 of transistor 70 is connected to a source of reference potential such as ground through emitter resistance 73, which as pointed out previously, has a very low value in the order of one (1) ohm or so.

A current diverting shunt transistor element 74 is effectively connected in parallel with the compound circuit, and in the manner described previously, draws sufficient current, in response to variations of emitter current of transistor 70, to maintain the gain of the system constant. The current diverting circuit 74 includes a PNP transistor 75 having a collector 76 connected to the input terminal 61 and the base 62 of transistor 64. The emitter 77 is connected to the junction of resistances 79 and 80 of a voltage divider comprising resistances 78, 79 and 80. A constant voltage device such as the Zener diode 81 is connected in shunt with resistances 79 and 80 and therefore maintains the voltage across the two resistances constant in spite of fluctuations in the unidirectional biasing voltage supply and thereby maintains the reference voltage at emitter 77 constant. The constant voltage at emitter 77 is at a much lower value than the breakdown voltage of Zener diode 81 by virtue of the voltage dividing action of resistances 79 and 80.

The base 82 of current diverting transistor 75 is connected to the junction of emitter 72 and emitter resistance 73 through an R.C. decoupling network 83 which bypasses the audio to ground. As was described previously, any change in emitter current flowing through resistance 73 varies the voltage sufficiently to control the collector current drawn by transistor 75, a condition which varies the magnitude of the input current to the compound circuit 63 sufficiently to maintain the gain of the circuit constant and to reduce the emitter current of transistor 70 to a predetermined value.

A transistor power amplifying circuit such as the one in FIGURES 1, 2 and 3 was found to function in the manner described. The following component values are exemplary of an operative circuit embodying the invention without limiting the invention thereto:

Transistor 3=GE 2N188A alloy junction transistor
Transistor 4=Clevite 1104 alloy junction transistor or GE 2N257 alloy junction transistor
Transistor 15=GE 2N324 alloy transistor
$R_{13}$=1 ohm
$R_{20}$=3900 ohms
$R_{21}$=100 ohms
$R_{22}$=5600 ohms
R.C. circuit 19=R=47 ohms, C=50 micro-farads
Zener diode=1N1313
B—=—13.8 volts It will be appreciated from the previous discussion that a transistorized power amplifier circuit with a self-adjusting bias arrangement has been described, a circuit which maintains constant gain conditions despite gain variations in previous stages.

Although a number of specific embodiments of the invention have been shown, it will, of course, be understood that the invention is not limited thereto since many modifications, both in the instrumentalities and circuit arrangement employed, may be made. It is contemplated by the appended claims to cover any such modifications as fall within the true spirit and scope of this invention.

What is claimed as new and desired to be secured by Letters Patent is:

1. In a transistor power amplifier, the combination including at least a transistor having an input, an output, and a common electrode, an input terminal coupled to said input electrode and having a D.C. input current impressed thereon, means for applying operating potential to the electrodes of said transistor to establish the quiescent biasing conditions for said transistor, a conductive path connected to said input terminal to divert a portion of said D.C. input current, means for sensing the magnitude of the transistor D.C. emitter-collector current in the common electrode circuit of said transistor to produce a control signal, and means coupling said control signal to said path for controlling the conductivity thereof to maintain the D.C. current flow in said common electrode circuit and the bias conditions of said transistor amplifier at a predetermined level.

2. In a self-regulating transistor power amplifier, the combination including at least a transistor having an input, an output, and a common electrode, an input terminal coupled to said input electrode and having a D.C. input current impressed thereon, means for applying operating potential to the electrodes of said transistor to establish the quiescent biasing conditions for said transistor, a conductive path connected to said input terminal to divert a portion of said D.C. input current including a transistor having emitter, base, and collector electrodes, means for sensing the magnitude of the D.C. emitter-collector current in the common electrode circuit of said transistor to produce a control signal proportional to the magnitude of said current, and means coupling said control signal to the base of said further transistor for controlling the conductivity thereof to maintain the D.C. current in said common electrode circuit and the bias conditions of said transistor amplifier at a predetermined level.

3. In a self-regulating transistor power amplifier, the combination including at least a transistor having emitter, base, and collector electrodes, said transistor being connected in a common emitter configuration, an input terminal coupled to said base and having a D.C. input current impressed thereon, means for applying operating potential to the electrodes of said transistor to establish the quiescent biasing condition for said transistor, a D.C. current diverting transistor having collector, emitter and base electrodes, the collector of said last named transistor being coupled to said input terminal, means for sensing the magnitude of the D.C. emitter-collector current in the emitter circuit of said transistor amplifier to produce a control signal proportional to the magnitude of the D.C. current, and means coupling said control signal to the base of said current diverting transistor for controlling the conductivity of the emitter-collector path of said transistor to maintain the D.C. current flow in the emitter electrode circuit of said transistor amplifier and the bias condition of said transistor amplifier at a predetermined level.

4. The self regulating transistor amplifier according to claim 3 including means to maintain the emitter electrode of said current diverting transistor at a predetermined reference signal level whereby said transistor becomes conductive whenever said control signal level is greater than said reference signal level.

5. The self regulating transistor amplifier according to claim 3 wherein the emitter of said current diverting transistor is connected to a voltage dividing network, which network provides a reference voltage to maintain said emitter at a predetermined reference level and to control the conductivity of said transistor in response to the difference in reference and control signal levels.

6. The self regulating transistor amplifier according to claim 5 wherein said voltage dividing network includes a constant voltage device to maintain the said reference level constant.

7. The self regulating transistor amplifier according to claim 3 wherein a reference voltage is applied to the emitter electrode of said current diverting transistor from a voltage dividing network to maintain said emitter at a predetermined reference level, said voltage dividing network including first, second and third resistance elements serially connected across a source of unidirectional voltage, a constant voltage diode element connected in parallel with said second and third resistances for maintaining the voltages across the resistances constant despite fluctuations in said unidirectional source, said emitter being connected to the junction of said second and third resistances.

8. In a self-regulating transistor power amplifier, the combination including first and second transistors each of which includes base emitter and collector electrodes, said first and second transistors being connected as a compound connected transistor amplifier circuit, an input terminal coupled to the base electrode of said first transistor and having a D.C. input current impressed thereon, means for applying operating potential to the electrodes of said first and second transistors to establish the quiescent biasing conditions for said transistors, a conductive path connected to said input terminal to divert a portion of the said D.C. input current, means for sensing the magnitude of the D.C. emitter-collector current in the emitter electrode circuit of said second transistor to produce a control signal, and means coupling said control signal to said path for controlling the conductivity thereof to maintain the D.C. current flow in said emitter circuit of said second transistor and the biased condition of said transistor amplifier at a predetermined level.

9. The transistor amplifier according to claim 8 wherein a resistance is connected to said emitter electrode of said second transistor for developing control voltage proportional to the emitter current.

References Cited by the Examiner

UNITED STATES PATENTS

| | | | |
|---|---|---|---|
| 2,895,045 | 7/59 | Kagan | 330—145 |
| 2,896,029 | 7/59 | Lin | 330—40 |
| 2,902,548 | 9/59 | Moeller | 330—145 |
| 2,999,169 | 9/61 | Feiner | 330—28 X |
| 3,099,802 | 7/63 | Mattern | 330—22 X |
| 3,117,287 | 1/64 | Damico | 330—29 X |

OTHER REFERENCES

Boxall: Base Current Feedback and the Feedback Compound Transistor, Semiconductor Products, Sept./Oct., 1958, pgs. 17–24.

Montgomery: High Input Impedance Transistor Amplifier, Electronic Design, August 6, 1958, pages 48–49.

ROY LAKE, *Primary Examiner.*

BENNETT G. MILLER, NATHAN KAUFMAN, *Examiners.*